United States Patent [19]

Garza

[11] Patent Number: 5,420,435
[45] Date of Patent: May 30, 1995

[54] ION IMPLANTATION MACHINE WITH PHOTONIC PRESSURE PARTICLE FILTER

[75] Inventor: Santos Garza, Lubbock, Tex.

[73] Assignee: Texas Instruments Incorporated, Dallas, Tex.

[21] Appl. No.: 110,042

[22] Filed: Aug. 20, 1993

[51] Int. Cl.6 .......................................... H01J 37/317
[52] U.S. Cl. ................................................ 250/492.21
[58] Field of Search .................... 250/251, 492.21, 398

[56] References Cited

U.S. PATENT DOCUMENTS 4,700,077  10/1987  Dykstra et al. ................. 250/492.21
5,170,890  12/1992  Wilson .............................. 250/251

Primary Examiner—Bruce C. Anderson
Attorney, Agent, or Firm—Lawrence J. Bassuk; Leo N. Heiting; Richard L. Donaldson

[57] ABSTRACT

A beam of radiant energy 50, 64 intersects a beam of ions 26 proximate the target 30 of the ions to force entrained contaminants out of the ion beam. The radiant beam of photons 50, 64 thus act as a filter for contaminants in the beam of ions.

7 Claims, 1 Drawing Sheet

ION IMPLANTATION MACHINE WITH PHOTONIC PRESSURE PARTICLE FILTER

FIELD OF THE INVENTION

This invention relates generally to machines implanting ions in semiconductor substrates to manufacture integrated circuits and particularly relates to providing a photonic pressure particle filter along the ion path to remove undesired particles from the ions being implanted in the semiconductor substrates.

DESCRIPTION OF THE RELATED ART

Integrated circuits contain selected types and amounts of dopants in selected areas to fabricate the desired circuits on semiconductor substrates. Ion implantation machines ionize, accelerate and direct the selected types of dopants along a beam at the silicon substrate targets. The accelerated ions enter the crystal lattice, strike the atoms in the substrate, and come to rest in the substrate at a controlled depth adjusted by the acceleration energy applied to the ions. The desired dopant concentration occurs by adjusting the ion current during implantation.

A basic ion implantation machine or system provides a high voltage enclosure, an acceleration tube and an end station. In the high voltage enclosure, a heated filament breaks the molecules of a gas into an ion plasma of charged particles. The ion plasma contains the desired ions, other ions and contamination. An extraction voltage moves the charged ions from the ionization area into an analyzer. The analyzer separates the desired ions from the other ions and contamination by moving the charged plasma through a bend using a magnetic field. Ions with the desired charge to mass ratio travel through the bend without striking the walls of the analyzer or any other strike plate and emerge from the analyzer in a beam of ions.

The beam of ions passes through the accelerator tube where they are electrically accelerated to the implantation energy. The implantation energy is adjusted by controlling the voltage difference between the accelerator tube and the reference potential at the target. Electrostatic deflection plates then sweep the beam across the semiconductor substrates mounted at the target in the end station.

A commercial ion implanter is typically 6 m long, 3 m wide and 2 m high, consumes 45 kWatts of power and can process 200 wafers of semiconductor substrate material in an hour at a dose of $10^{15}$ ions/cm$^2$ with 100 mm wafers.

Ion implantation has been considered a clean process because the machine separates contaminant ions from the beam before the beam strikes the substrates. Contamination still occurs however. For example, particles can be introduced in the machine during loading of the wafers and can be knocked from the walls of the machine surrounding the ion beam. These particles can be as large as half the feature size of the circuits being formed. If these particles become entrapped in the ion beam after the analyzer, there exists no way to filter them from the beam and when they strike the substrate targets they prevent proper implantation of dopants and formation of the circuits; this results in poor production yields for all of the parts.

The entrapment force of the particles in the beam exceeds the force of gravity, so arranging the beam of ions normal to the pull of gravity fails to remove the particles from the beam. Electrostatic and magnetic forces fail to remove the particles from the beam because they act equally on the desired and undesired ions. Further, the particles often-enter the beam of desired ions close to the target substrates where further bends to remove undesired particles become impractical.

SUMMARY OF THE INVENTION

An ion implantation machine provides a contaminant filter in the form of a beam of radiant energy striking the beam of ions to dislodge contaminant particles from the beam of ions. The radiant beam of photons preferably acts on the beam of ions in a direction that is additive to the pull of gravity on the entrapped contaminant particles. The force applied by the beam of radiant energy moves the undesired particles towards the periphery of the beam of ions, from which the pull of gravity acts further to extract the particles from the beam of ions. The photonic pressure produced in the beam of ions effects a filtering action that can be implemented close to the target wafers or substrates.

BRIEF DESCRIPTION OF THE DRAWING FIGURES

DETAILED DESCRIPTION

Figure 1:
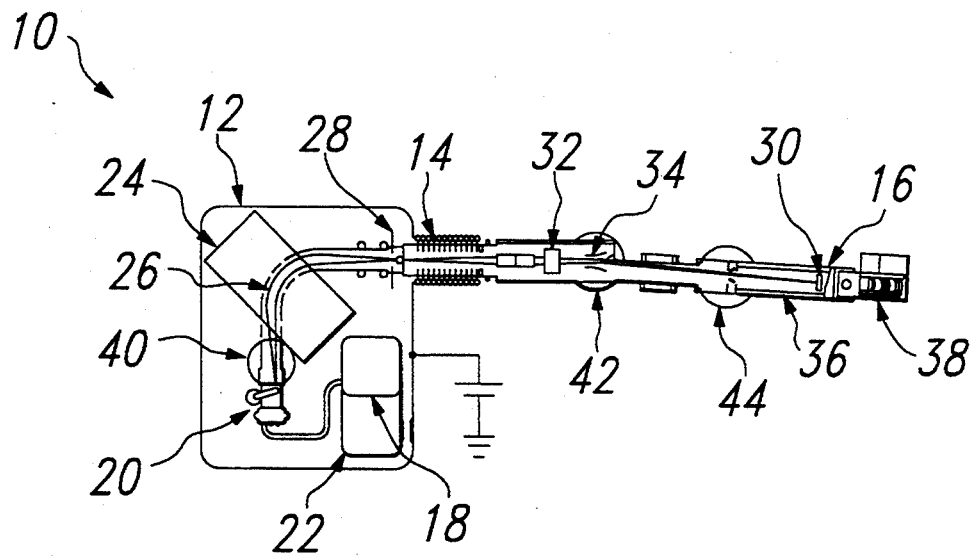
FIG. 1 is an idealized schematic diagram of a known ion implantation machine.

FIG. 1 depicts a medium energy ion implantation system 10 that delivers a beam of ions of a particular type and energy to the surface of a silicon wafer. Ion implantation system 10 comprises high voltage enclosure 12, acceleration tube 14 and end station 16.

Gas source 18 feeds a small quantity of source gas such as BF$_3$ into an ion source 20 where a heated filament causes the molecules to breakup into charged fragments or ions. Ion source power supply 22 powers the ion source. The charged fragments in the ion source form an ion plasma containing the desired ions together with many other species of ions, other fragments and contamination. An extraction voltage of around 20 kV formed between the ion source 20 and an analyzer magnet 24 moves the charged ions out of the ion source 20 into the analyzer magnet 24. The analyzer magnet 24 turns the beam 26 through ions to substantially a right angle so that only ions with the desired charge to mass ratio can travel through without being blocked by the analyzer walls. Resolving aperture or strikeplate 28 operates as a block for ions having a charge to mass ratio close to but different from the desired ions in beam 26.

The ions in beam 26 that pass through resolving aperture 28 enter acceleration tube 14. Acceleration tube 14 applies a high voltage to the ion beam relative to a reference or ground voltage occurring at the wafer target 30 in end station 16. The high voltage is selected to accelerate ions in the beam 26 to the desired implantation energy. Y scan plates 32 and X scan plates 34 can be provided as desired to control scanning of the ion beam over the surface of the semiconductor wafer target 30.

End station 16 comprises a Faraday cage 36 and a wafer feeder mechanism 38.

A source diffusion pump 40 reduces the pressure in the high voltage enclosure below $10^{-6}$ TORR. A beam line diffusion pump 42 and an end station diffusion pump 44 likewise act to maintain the low pressure in of the system 10 to minimize ion scattering by gas molecules.

The problem resolved by the present invention is the inclusion of contaminant particles in the ion beam 26 after it passes through the resolving aperture 28 from the accelerator tube 14 to the wafer target 30. Particularly, submicron sized particles can cause problems in semiconductor products having submicron feature sizes.

Figure 2:
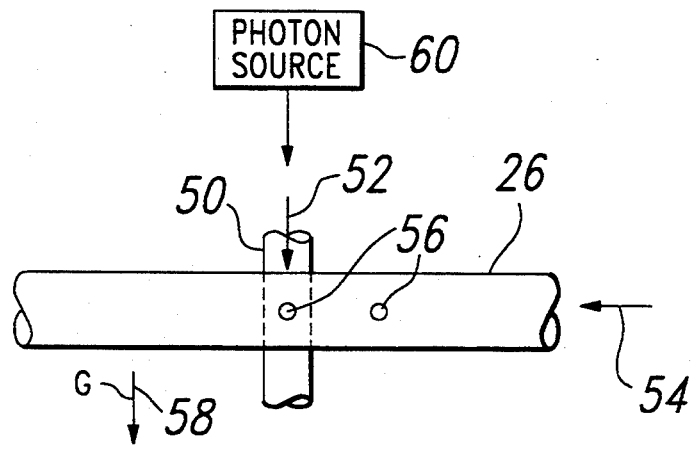
FIG. 2 is a perspective view of the radiant beam of photons striking the beam of ions.

In FIG. 2, the present invention uses a radiant beam 50 of photons traveling in the direction indicated by arrow 52 intersecting the beam 26 of ions moving in the direction indicated by arrow 54. The radiant beam 50 exerts a force on the contaminants 56 entrained or entrapped in ion beam 26 to move them towards the periphery of ion beam 26. Preferably radiant beam 50 acts or intersects the ion beam 26 in the direction of gravity G indicated by arrow 58. With the radiant beam 50 moving the contaminant particles 56 to the periphery of ion beam 26, gravity then acts on contaminant particles 56 to extract them from the ion beam 26. Radiant beam 50 contains photons from a source 60 with the radiant energy occurring in the infrared range.

Ion beam 26 in a medium energy implantation machine typically has a circular configuration with a diameter of about one centimeter. In this example, the radiant beam 50 would have a rectangular cross-sectional shape with a width of about one and a half centimeters and a thickness of about a half a centimeter. Other Configurations of the ion beam and radiant beam are possible while remaining within the claimed invention. Source 60 will be an infrared laser providing a continuous beam with a power level of about 200-300 milliwatts.

An explanation of the mathematics used to select the desired energy range for the radiant beam 50 occurs in a book by Eugene Hecht, *"Optics"* Second Edition, pages 45-47, Addison-Wesley Publishing Company, 1987. That reference discloses the optical levitation of a one-thousandth of an inch diameter transparent glass sphere on and upwardly directed 250 mW laser beam.

The use of radiant energy 50 to dislodge contaminant particles 56 from ion beam 26 works well in the ion implantation system 10 by avoiding the use of any electric or magnetic fields or pressure differentials to act upon ion beam 26. The radiant energy beam 50 acts substantially only on contaminant particles 56 while the charged ions in beam 26 maintain their desired direction of flow.

Figure 3:
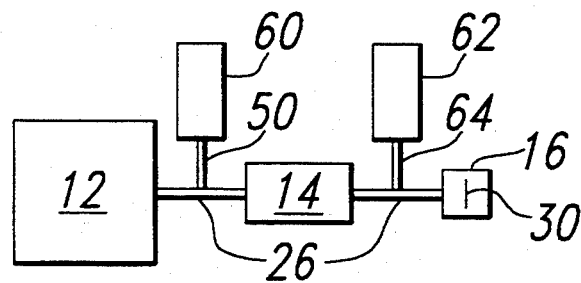
FIG. 3 is a block diagram of an ion implantation machine according to the invention.

In FIG. 3, photon source 60 can be arranged to provide radiant beam 50 of photons between the high voltage enclosure 12 and the accelerator tube 14. Alternatively, photon source 62 can provide radiant beam 64 intersecting the ion beam 26 between accelerator tube 14 and end station 16 enclosing wafer target 30. Providing the radiant beam of photons after the resolving aperture of the high voltage enclosure avoids any further bending of the ion beam 26 to remove contaminant particles and avoids any further electrostatic plates attempting to remove contaminant particles.

The invention can be practiced other than as disclosed. For example the photon beams 50 or 64 can intersect the ion beam 26 at any desired location before the wafer target 30 and the photon beams 50 and 64 can act in directions other than parallel to the force of gravity. Radiant beams of other energies can also be used, as well as radiant beams of desired intensity and width.

I claim:
1. An ion implantation machine comprising:
    a. a high voltage section providing a beam of ions containing desired and undesired particles;
    b. an accelerator section accelerating the ions along the beam;
    c. an end station for enclosing a target to receive the ions accelerated along the beam; and
    d. a photonic pressure particle filter positioned along and intersecting the beam between the high voltage section and the target and providing a beam of radiant energy of sufficiently high energy to move the undesired particles at least partially from the beam of ions before the undesired particles strike the target.
2. The machine of claim 1 in which the beam of radiant energy provides photons occurring in the infrared wavelengths.
3. The machine of claim 1 in which the filter is positioned between the high voltage section and the accelerator section.
4. The machine of claim 1 in which the filter is positioned between the accelerator section and the end station.
5. The machine of claim 1 in which the filter includes a continuous infrared laser having a power output of about 200-300 milliwatts.
6. An ion implantation machine comprising:
    a. a high voltage section providing a beam of ions;
    b. an accelerator section accelerating the ions along the beam;
    c. an end station for enclosing a target to receive the ions accelerated along the beam; and
    d. a photonic pressure particle filter positioned along the beam between the high voltage section and the target and providing a beam of radiant energy of sufficiently high energy to move undesired particles at least partially from the beam of ions before the undesired particles strike the target, in which the beam of radiant energy acts in the direction of the pull of gravity.
7. An ion implantation machine comprising:
    a. a high voltage section providing a beam of ions;
    b. an accelerator section accelerating the ions along the beam;
    c. an end station for enclosing a target to receive the ions accelerated along the beam; and
    d. a photonic pressure particle filter positioned along the beam between the high voltage section and the target and providing a beam of radiant energy of sufficiently high energy to move undesired particles at least partially from the beam of ions before the undesired particles strike the target, in which the beam of radiant energy has a width greater than the width of the beam of ions.

* * * * *